(12) United States Patent
Rouaissia et al.

(10) Patent No.: US 10,423,278 B2
(45) Date of Patent: Sep. 24, 2019

(54) DRIFT SUPPRESSION FILTER, PROXIMITY DETECTOR AND METHOD

(71) Applicant: Semtech Corporation, Camarillo, CA (US)

(72) Inventors: Chaouki Rouaissia, Neuchâtel (CH); Sébastien Grisot, Boudry (CH)

(73) Assignee: Semtech Corporation, Camarillo, CA (US)

( * ) Notice: Subject to any disclaimer, the term of this patent is extended or adjusted under 35 U.S.C. 154(b) by 94 days.

(21) Appl. No.: 15/868,602

(22) Filed: Jan. 11, 2018

(65) Prior Publication Data

US 2018/0329575 A1    Nov. 15, 2018

(30) Foreign Application Priority Data

May 12, 2017   (EP) .................................... 17170848

(51) Int. Cl.
*G06F 3/041* (2006.01)
*G06F 3/044* (2006.01)
*H03K 17/955* (2006.01)

(52) U.S. Cl.
CPC ............ *G06F 3/0418* (2013.01); *G06F 3/044* (2013.01); *H03K 17/955* (2013.01); *H03K 2217/94026* (2013.01)

(58) Field of Classification Search
None
See application file for complete search history.

(56) References Cited

U.S. PATENT DOCUMENTS

| 4,463,272 A * | 7/1984 | Tucker ................... G01R 17/06 327/14 |
| 8,040,142 B1 | 10/2011 | Bokma et al. |
| 2007/0032967 A1 | 2/2007 | Feen et al. |
| 2008/0158182 A1 | 7/2008 | Westerman |
| 2010/0214253 A1 | 8/2010 | Wu et al. |
| 2012/0050211 A1 * | 3/2012 | King ..................... G06F 3/0416 345/174 |
| 2012/0293447 A1 | 11/2012 | Heng et al. |

FOREIGN PATENT DOCUMENTS

EP   3016285 A1   3/2015

OTHER PUBLICATIONS

European Search Report for EP Application No. 17209779.2, dated Jul. 12, 2018, 7 pages.

* cited by examiner

*Primary Examiner* — Clayton E. LaBalle
*Assistant Examiner* — Jas A Sanghera
(74) *Attorney, Agent, or Firm* — Blank Rome LLP

(57) ABSTRACT

A portable device including drift-compensated capacitive proximity sensor that exploits a special method of drift compensation based on the variation of the measured proximity signal. The drift is tracked when the variation is within a stated interval, and frozen when the variation is outside. The sensor is capable of following a drift not only when the phone is inactive, but also when it is close to the body of the user, by freezing the tracking when the capacity varies steeply, as when the user moves the device, and resuming it when the variation is within acceptable limits.

6 Claims, 2 Drawing Sheets

DRIFT SUPPRESSION FILTER, PROXIMITY DETECTOR AND METHOD

REFERENCE DATA

The present application claims priority of European Patent Application EP17170848.0 of May 12, 2017, the contents whereof are incorporated by reference.

FIELD OF THE INVENTION

The present invention concerns a filter arranged to suppress a slow drift from a signal representing a quantity of interest. Embodiments of the invention relate to a digital implementation of the aforesaid drift suppression filter, and to a proximity detector that uses the aforesaid filter to discriminate between a legitimate signal, for example the approach of a person, and a drift generated by temperature variations or any other reason. These are not, however, the only applications of the invention.

DESCRIPTION OF RELATED ART

In a number of measuring and sensing applications, relevant information is carried by an electric value (i.e., a voltage or a current) that represents a quantity of interest, to which is superposed a spurious value that may be constant or drifting slowly. Since the presence of the spurious baseline is a limit to the sensitivity and precision of the measure, a number of algorithms and filters have been devised to eliminate it from the signal of interest.

When the signal that must be measured varies much faster than the drifts in the baseline, the latter can be suppressed by a straightforward high-pass filter. In some cases, the same result is obtained by computing a running average value of the signal, that is taken to represent the drift, and subtracting it from the original signal. FIG. 1, which will be discussed later, shows a digital implementation of this drift-suppression process that is in use in capacitive proximity detectors, provided unit 60 implements a straightforward running average.

Capacitive proximity detectors are used in many modern portable devices, including mobile phones and tablets, to determine whether the device is close to a body part of a user. This information is important in several ways: it is used to detect whether the telephone is being actively manipulated by a user, and whether the user is looking at the display, in which case the information displayed can be adapted, and/or the device switch from a low power state to an active one. Importantly, this information is used to adapt the power level of the radio transmitter to comply with body dose limits. Capacitive proximity detection is used also in touch-sensitive displays and panels.

Capacitive proximity detection depends critically from drift suppression. Typically, the capacity of the approaching user's body, seen from an electrode on the device, is many times smaller than the background capacity of the electrode itself. This background value and its fluctuations would totally mask the proximity signal, were they not eliminated.

It is known to use a reference sensor, for example, in the case of a proximity detector, an identical electrode that is not sensitive to the capacity of the user's body, to compensate and subtract the background signal. This method, although effective, is far from perfect, due to the unavoidable differences between the active sensor and the reference one, and to thermal non-equilibrium effect, which give rise to different and independent background levels in the active sensor and in the reference.

Another limitation of known methods and processors resides in that they tend to reduce the signal that is sought for as well as the drift.

A particular limitation of the known methods is that, often, they veto the drift compensation in presence of large signals. Many known portable telephones, for example, include a capacitive proximity detector like that described above, and use it to determine whether the phone is resting say, on a table, or the user has brought it to the ear. In the former case, the measured capacity will be low, and the drift compensation will follow its wanderings. When the phone is close to the body, the capacity ill be large and vary considerably due to the user's movements. Conventional drift compensation circuits are disabled when the phone is in proximity to the body, to avoid that the capacity variations due to the user's movement should be misinterpreted as thermal drift. This has however the inconvenient that, if the baseline is not tracked for a certain time, the proximity detector may fail to detect when the telephone is taken away from the body.

BRIEF SUMMARY OF THE INVENTION

The present invention proposes a drift-suppression filter, as well as an environmental sensor, for example a capacitive proximity sensor equipped with the drift suppression. Other aspects of the invention concern a portable electronic device with a capacitive proximity detector and the drift-suppression filter. The special filtering features, which are specified in the appended claims, provide superior suppression of environmental drift preserving sensitivity. The present invention also encompasses the filtering method of the corresponding claims.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Figure 1:
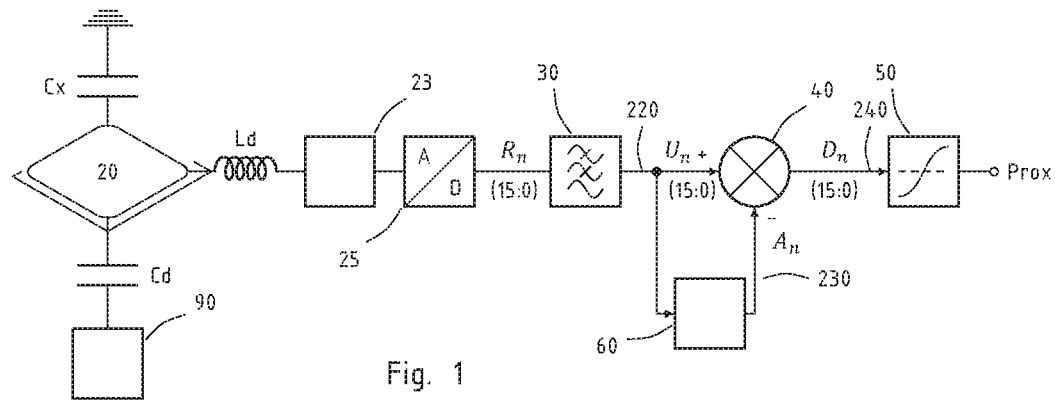
FIG. 1 shows schematically a digital drift-suppression filter

FIG. 1 shows schematically a drift-suppression processor. For the sake of concision, the present description will refer to a capacitive proximity detector in a portable phone or tablet, but it should be understood that the filter and the method of the invention could be applied to diverse fields.

The detector is sensitive to the capacity Cx of an electrode 20 that will increase slightly at the approach of a user's hand, face or body. As already discussed, the variations due to body proximity are overshadowed by the own capacity of the electrode which, in turn, is not stable. The capacity signal preferably amplified and processed by an analogue processor 23, which may also subtract a programmable offset, and converted into raw digital values by an A/D converter 25. The samples $R_n$ may be encoded as 16 bits integers, or in any other suitable format.

The raw samples $R_n$ contain also, in a non-ideal world, noise and unwanted disturbances that are attenuated by a filter 30. The filter 30 may be a digital low-pass filter, dimensioned in consideration of the bandwidth of the expected signal, or any other suitable filter. The filter 30 provides a series of samples $U_n$ useful for the processing in the successive stages.

The unit 60 is a baseline estimator that generates a series of samples $A_n$ that approximate the instantaneous value of the baseline, considering drift. This is then subtracted from the $U_n$ samples in difference unit 40 and provides the drift-corrected samples $D_n$. A discriminator unit 50 then generates a binary value 'Prox' that indicates the proximity of the user's hand, face, or body. The invention is not limited to a binary output, however, and encompasses detectors that generate multi-bit proximity values as well.

The capacitive proximity sensor may be part of a cellphone, a laptop, a tablet, or another connected portable device. In this case, the capacitive electrode 20 could serve also as RF antenna. FIG. 1 shows this optional feature of the invention: the electrode 20 is connected, through a decoupling capacitor Cd, to a radio transmitter and receiver unit 90, and has an inductor Ld to block the radiofrequency signal.

Figure 2:
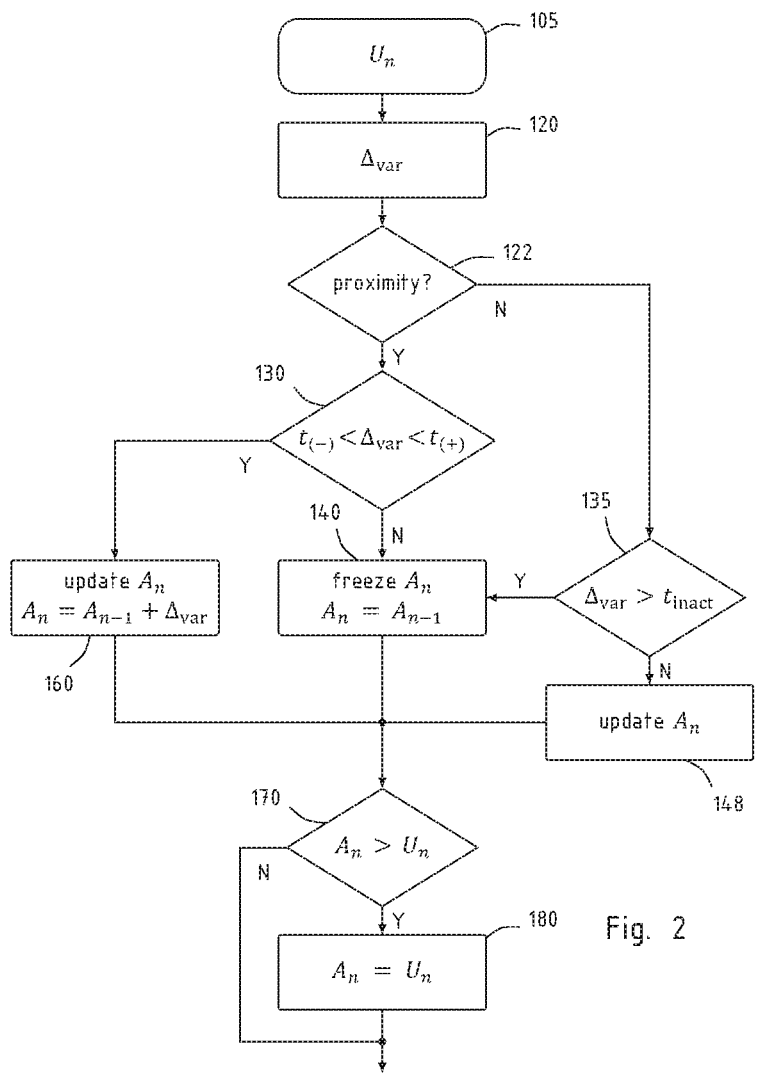
FIG. 2 illustrates with a flowchart, a method of suppressing a drift according to an aspect of the invention.

In conventional proximity detectors, the baseline estimation unit 60 computes $A_n$ a running average of the $U_n$ samples. The invention, however, adopts a different method that will be now explained with reference to FIG. 2.

An important aspect of the method of the invention is (step 120) the estimation of the variation of the useful signal $U_n$. The variation is represented by a quantity $\Delta_{var}$ that is preferably computed at each new useful sample $U_n$ (step 105). A possible manner of estimating the variation of $U_n$ is the difference between a sample and the preceding one, $\Delta\_var = U_n - U_{n-1}$ or preferably, a running average of the differences $U_n - U_{n-1}$ in a suitable window, for example the last eight received samples of $U_n \cdot \Delta_{var}$, however, could denote any other suitable estimator of the variation.

At step 122 the method of the invention checks whether the proximity signal is active, i.e. whether there are indications that a conductive body is nearby. If the result of this test is positive, the method tests (step 130) whether the variation $\Delta_{var}$ is in a predetermined region of acceptation. In the example, $\Delta_{var}$ is compared with a lower threshold $t_{(-)}$, which may be negative, and an upper threshold $t_{(+)}$ that will be, in most cases, positive.

If the variation is in the region of acceptation, the method of the invention treats it as a drift, and updates the baseline estimation to track it (step 160). The new value for $A_n$ could be computed by adding to the previous one the value of the variation $\Delta_{var}$, or in any other manner.

If, on the other hand, the variation $\Delta_{var}$ is not in the predetermined region of acceptation ($t_{(-)}, t_{(+)}$) the method of the invention treats it as a movement of the phone and/or of the user and not as a drift. In step 140, the previous value of the baseline estimation, $A_{n-1}$ is copied into the new one $A_n$. In this manner, the baseline estimation $A_n$ is frozen to a constant value.

Optionally, as shown in this example, the baseline estimation $A_n$ can be frozen based on the variation $\Delta_{var}$ also when the proximity signal is not active. This is the case of the example shown where, at step 135, the variation $\Delta_{var}$ is compared with another threshold value $t_{inact}$. If the variation exceeds this value, the baseline estimation is frozen (step 140), otherwise the value of $A_n$ is updated based on the samples ($U_n, U_{n-1}, \ldots$) in any suitable manner (step 148). In a possible implementation, $A_n$ may be set equal to $U_{n-1}$, or to an average of past $U_n$ samples.

Optional steps 170 and 180 prevent that the value $A_n$ exceeds that of $U_n$, thereby ensuring $D_n > 0$.

Figure 3:
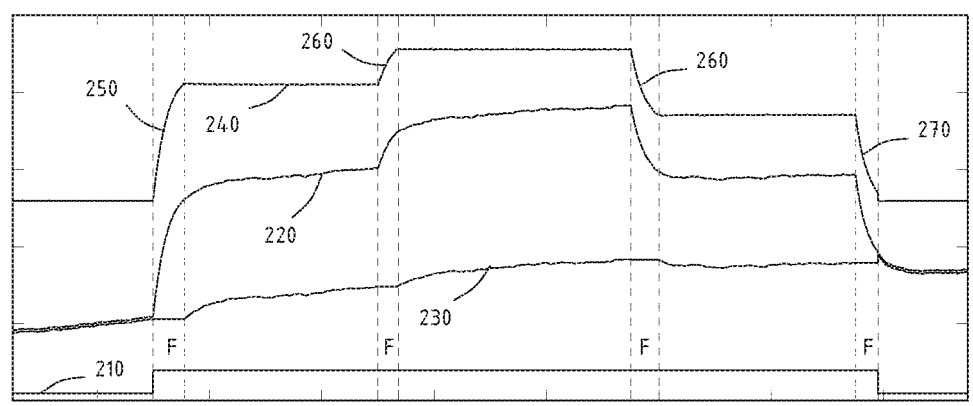
FIG. 3 is a plot of some signals used in the invention.

The advantage of the inventive method is that the baseline estimation $A_n$ tracks the drift also when the telephone is close to the user's body. FIG. 3 illustrates this aspect. In this plot, the line 210 is the 'Prox' detection signal, 220 represents the useful samples $U_n$, and 230 the baseline estimation $A_n$. The drift-corrected signal $D_n$ is referenced as 240. The edges 250, 270 mark the times when the phone was brought to and removed from the ear, and the steps 260 are capacity changes due to movements.

As it can be appreciated, the baseline estimation $A_n$ is frozen in the intervals (marked with 'F') in which the signal $U_n$, varies strongly, and tracks the general drift of $U_n$ otherwise. The drift is completely eliminated from the corrected signal 240, and the instants at which the device is brought close to and farther from the body can be discriminated very reliably.

The invention claimed is:

1. A portable device including a proximity sensor, wherein the proximity sensor generates a proximity signal representing the distance between the device and a body part of a user, the portable device including a decision unit arranged to determine whether the portable device is in a predetermined relationship of proximity with the body part, and a drift compensation unit arranged to track and subtract a drift from the proximity signal generating a drift-compensated signal, and an output discriminator, asserting a logical proximity value when the drift-compensated signal exceeds a predetermined distance threshold, characterized in that the drift compensation unit is arranged to measure a variation of the proximity signal in a determined time interval, to freeze the tracking of the drift when the logical proximity value is asserted and the variation is not in a predetermined acceptance region, or the variation is in a predetermined freezing region.

2. The portable device of claim 1, arranged to increment the drift by a value derived from said variation when the variation is inside the acceptance region.

3. The portable device of claim 1, arranged to freeze the tracking of the drift when the variation is above a determined inactivity threshold, and the logical proximity value is not asserted.

4. The portable device of claim 1, arranged to modify a radiated power based on the logical proximity value.

5. The portable device of claim 1, wherein the proximity sensor is capacitive.

6. A method of drift compensation in a detector, comprising the steps of acquiring a signal representing a sensed quantity, track and subtract a drift from the signal generating a drift-compensated signal, and assert a logical output value when the drift-compensated signal exceed a predetermined output threshold, characterized by measuring a variation of the signal in a determined time interval, conditionally freezing the tracking of the drift when the output value is asserted and the variation is not in a predetermined acceptance region.

* * * * *